United States Patent [19]
Newton

[11] 3,990,004
[45] Nov. 2, 1976

[54] MULTI-FREQUENCY RANGE OPERATION OF A NETWORK ANALYZER SYSTEM

[75] Inventor: Sterling Lewis Newton, Santa Rosa, Calif.

[73] Assignee: Hewlett-Packard Company, Palo Alto, Calif.

[22] Filed: Aug. 14, 1975

[21] Appl. No.: 604,700

[52] U.S. Cl. ............................................. 324/57 SS
[51] Int. Cl.² ........................................ G01R 27/00
[58] Field of Search ....................... 324/57 SS, 57 R

[56] References Cited
UNITED STATES PATENTS
3,427,535  2/1969  Welsh .............................. 324/57 SS Primary Examiner—Stanley T. Krawczewicz
Attorney, Agent, or Firm—David A. Boone

[57] ABSTRACT

A network analyzer is coupled to a multi-band sweep oscillator and a display device to provide measurement and plotting of circuit parameters. Bi-directional interface circuits allow phase locking by the network analyzer over broad frequency sweeps and enable smooth and accurate plotting of system parameters despite frequency band switching by the sweep oscillator and relocking on new harmonic numbers by the network analyzer.

11 Claims, 9 Drawing Figures

MULTI-FREQUENCY RANGE OPERATION OF A NETWORK ANALYZER SYSTEM

BACKGROUND OF THE INVENTION

Network analyzer systems enable complete characterization of a network through measurement of the magnitude and phase of its input and transfer characteristics. Typically, these systems include a display device to present a graphical vector representation of the network characteristics. See, for example, U.S. Pat. No. 3,371,273 of Andrew Alford entitled "Automatic Impedance Measuring System Utilizing a Hybrid-Like Network Operating Over a Wide Range of Frequencies".

A key technique that allows a microwave network analyzer to measure complex ratios is the technique of frequency translation by sampling. A block diagram of a network analyzer shown in FIG. 9 is helpful in understanding this technique. Sampling as used in a system of this type is a special case of heterodyning, which translates the input signals to a lower, fixed IF frequency where normal circuitry can be used to measure amplitude and phase relationships. The principle is to exchange the local oscillator of a conventional heterodyne system with a pulse generator which generates a train of very narrow pulses. If each pulse within the train is narrow compared to a period of the applied RF signal, the sampler becomes a harmonic mixer with equal efficiency for each harmonic. Thus, sampling-type mixing has the advantage that a single system can operate over an extremely wide input frequency range.

In order to make the system capable of swept frequency operation, an internal phase-lock loop keeps one channel of the two-channel network analyzer tuned to the incoming signal. Tuning of the phase-lock loop is automatic. When the loop is unlocked, a search oscillator tunes the voltage tuned oscillator back and forth across a portion of whatever octave-wide frequency band has been selected by the user. When any harmonic of the voltage tuned oscillator frequency falls a predetermined interval, e.g., 20 MHz, below the input frequency, i.e., when $f_{in} - nf_{osc} = 20$ MHz, the loop stops searching and locks.

The IF signals reconstructed from the sampler outputs in both channels are the same frequency, e.g., 20 MHz, but, since frequency conversion is a linear process, these signals have the same relative amplitudes and phases as the microwave reference and test signals. Thus, gain and phase information are preserved, and all signal processing and measurements take place at a constant frequency.

The IF signals are first applied to a pair of matched AGC (automatic gain control) amplifiers. The AGC amplifiers perform two functions: they keep the signal level in the reference channel constant, and they vary the gain in the test channel so that the test signal level does not change when variations common to both channels occur. This action is equivalent to taking a ratio and removes the effect of power variations in the signal source, of frequency response characteristics common to both channels, and of similar common-mode variations.

Typically, before the signals are sent to the display unit, a second frequency conversion, e.g., from 20 MHz to about 278 kHz, is performed. To obtain the desired amplitude ratio and phase measurements, the phase-gain indicator contains a linear phase detector and an analog logarithmic converter. Ratio (in dB) and relative phase can be read on a meter of the display unit or de-coupled voltages proportional to gain (as a linear ratio or in dB) and phase for display on the vertical channels of an oscilloscope or X-Y recorder may be provided. If the horizontal input to the oscilloscope or recorder is a voltage proportional to frequency, the complete amplitude and phase response of the test device can be displayed.

Previous network analyzer systems have made network measurements over octave frequency ranges. Various techniques were employed to achieve a complete display when analyzing multi-octave circuit performance. One technique was to record multiple measurements and then concatenate the resulting displays. Alternatively, the sweep was taken over a two- or three-octave range while sweeping very slowly. Slow sweep rates minimize the unusable portion of the displayed data which occurs as the system continues sweeping when the phase-lock loop is unlocked and acquiring a new lock-point. In these ways, attempts were made to minimize the perturbations created in the display during a switch between harmonic numbers by the network analyzer phase-lock loop. Nevertheless, these perturbations frequently resulted in anomalous indications on the display which obscured or limited the value of the data displayed. Hence, one problem in acquiring truly broadband coverage in a network analyzer system was the need to relock on a new harmonic number for each octave in the frequency range covered.

Another problem was that sweep oscillators (sweepers) having truly broadband sweep ranges frequently employ a sequence of smaller bands. This is sometimes accomplished by using a single oscillator followed by an harmonic multiplier to produce the higher frequencies (see, for example, the Hewlett-Packard Journal, March 1975, "A High Performance 2 to 18 GHz Sweeper"). Therefore, during the switch by the sweeper to the next frequency band the network analyzer system would again become unlocked.

SUMMARY OF THE INVENTION

According to the preferred embodiment of the present invention, a system includes a sweep oscillator, a network analyzer, and a display device. Under the control of system interface circuits, the network analyzer automatically relocks when necessary and picks its own frequency range. These interface circuits also stop the sweeper when the network analyzer becomes unlocked. Similarly, the display operation is suspended momentarily during phase relock or frequency band switch operations.

DESCRIPTION OF THE PREFERRED EMBODIMENT

Figure 1:
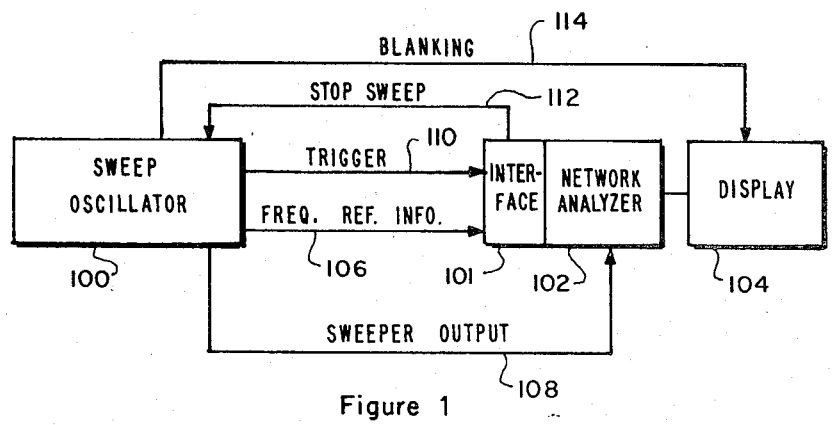
FIG. 1 is a block diagram of the preferred embodiment.

FIG. 1 shows a sweep oscillator (sweeper) 100 coupled to a network analyzer 102 and a display 104. An output signal from sweeper 100 is coupled to the network analyzer on a line 108. A signal on a line 106 indicates the frequency of the signal on line 108 by an analog voltage or a digital word. The preferred embodiment utilizes an analog voltage on line 106 to represent the sweeper frequency on a linear scale. A logarithmic analog to digital converter 206 is used to divide this scale into intervals spaced every half-octave.

The synchronization of sweeper 100, network analyzer 102, and display 104 is provided by a signal on a line 110, a stop sweep signal on line 112, and a blanking signal on line 114. Whenever network analyzer 102 loses phase-lock with the signal on line 108 from sweeper 100, network analyzer 102 will send a signal on line 112 and thereby stop the sweeper output signal on line 108 from changing frequency. The signal on line 112 will be removed and sweeper 100 will resume operation after a sufficient delay, 2 to 3 milliseconds in the preferred embodiment, to allow the network analyzer to relock and become stable again. Whenever sweeper 100 starts a new frequency band or does any sweeper-initiated action which may require network analyzer 102 to relock on a new harmonic number, sweeper 100 will generate the signal on line 110. Temporary suspension of the display operation is accomplished by the blanking signal on line 114 whenever the above conditions require stopping of the sweeper output signal on line 108.

Figure 2:
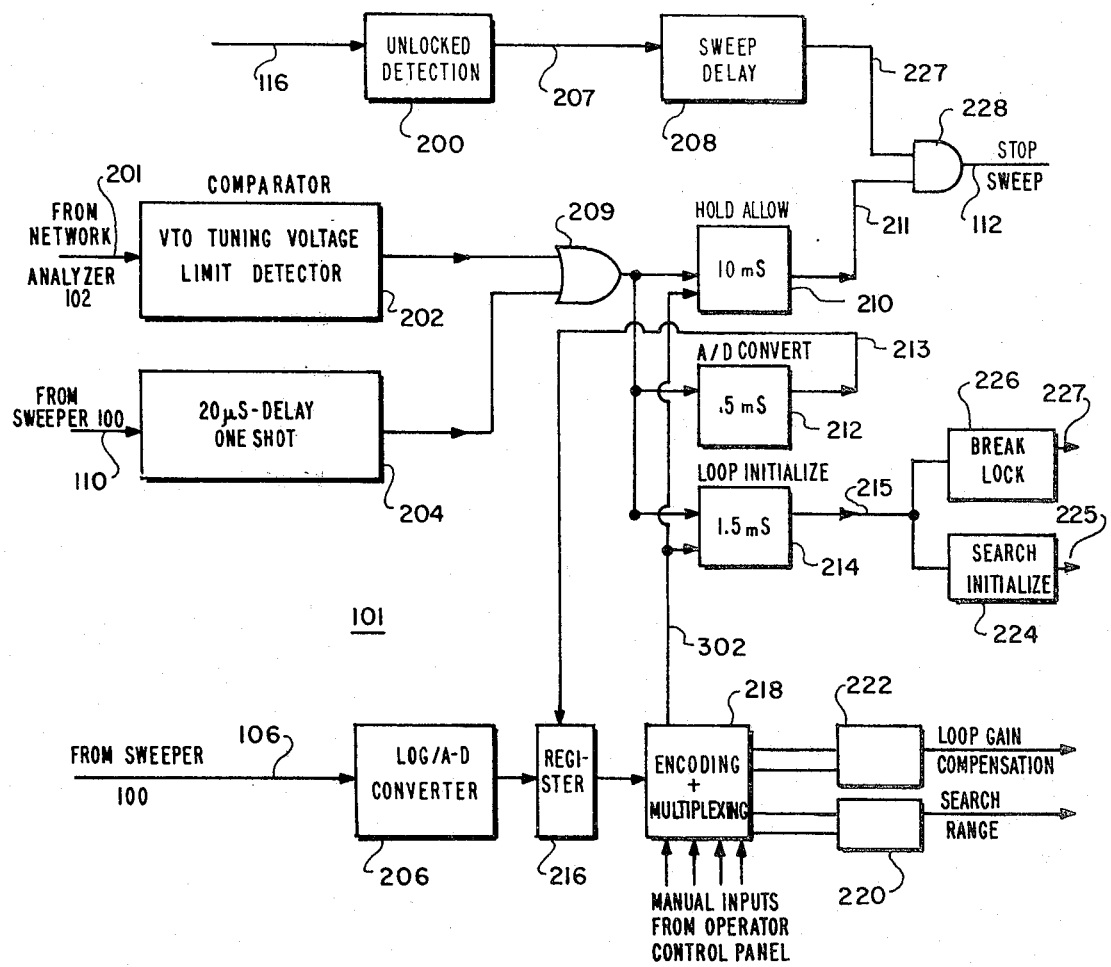
FIG. 2 is a block diagram of the interface circuitry of the network analyzer in the preferred embodiment.

Fig. 2 shows a block diagram of an interface circuit used in the network analyzer of the preferred embodiment. An unlocked condition in the network analyzer phase-lock loop is detected by a circuit 200 which causes delay circuit 208 to provide a signal on line 227 to gate 228. When a circuit 210 is providing an enable signal on line 211, gate 228 will respond to the detection of an unlocked condition by circuit 200 by providing the signal on line 112. However, when lock is regained, circuit 208 will delay the removal of the signal on line 227 for 1.6 milliseconds to ensure that the network analyzer phase-lock loop is firmly locked and all related circuitry has settled before the signal on line 112 is removed. Circuit 210 is enabled through gate 209 by comparator 202 or a one-shot 204. Comparator 202 enables circuit 210 when the tuning voltage of the network analyzer Voltage Tuned Oscillator (VTO) on a line 201 reaches a predetermined upper limit, indicating that a new harmonic number will be required in the network analyzer phase-lock loop to maintain phase-lock at the frequency of the sweeper output signal on line 108. One-shot 204 is triggered by the signal on line 110 which indicates that sweeper 100 has initiated some internal operation which may require relock on a new harmonic number.

Sweeper 100 sends the signal on line 110 when it is ready to resume operations after retracing to a starting frequency or after switching itself through a sequential break point between frequency bands. Circuit 210 only allows unlocked detection circuit 200 to stop sweeper 100 during a 10 millisecond interval after a signal is received from comparator 202 or one-shot 204. This allows sufficient time for relock and prevents the system from permanently stopping if it cannot lock at a particular point.

One-shot circuit 212 controls the decoding of the signal on line 106 from sweeper 100. A signal on line 213 is provided for sufficient time to allow the frequency information signal on line 106 to be decoded. During the automatic operation, the signal on line 106 is converted to a digital word by a converter circuit 206 and stored into a register 216 in response to a signal from one-shot 212. This word controls the setting of programmable resistances 220 and 222, through an encoding and multiplexing circuit 218, as discussed in more detail below. Programmable resistors 220 are then set for an appropriate search range and programmable resistors 222 are then set for an appropriate loop gain compensation. Programmable resistors 222 provide lower gain as the frequency of the sweeper output increases. Since a higher harmonic number means a greater variation in frequency, programmable resistors 220 narrow down the search range to prevent the network analyzer from searching too far. Note that, in the manual mode, these resistances would be selected by switch settings on an operator control panel, through encoding and multiplexing circuit 218.

Figure 6:
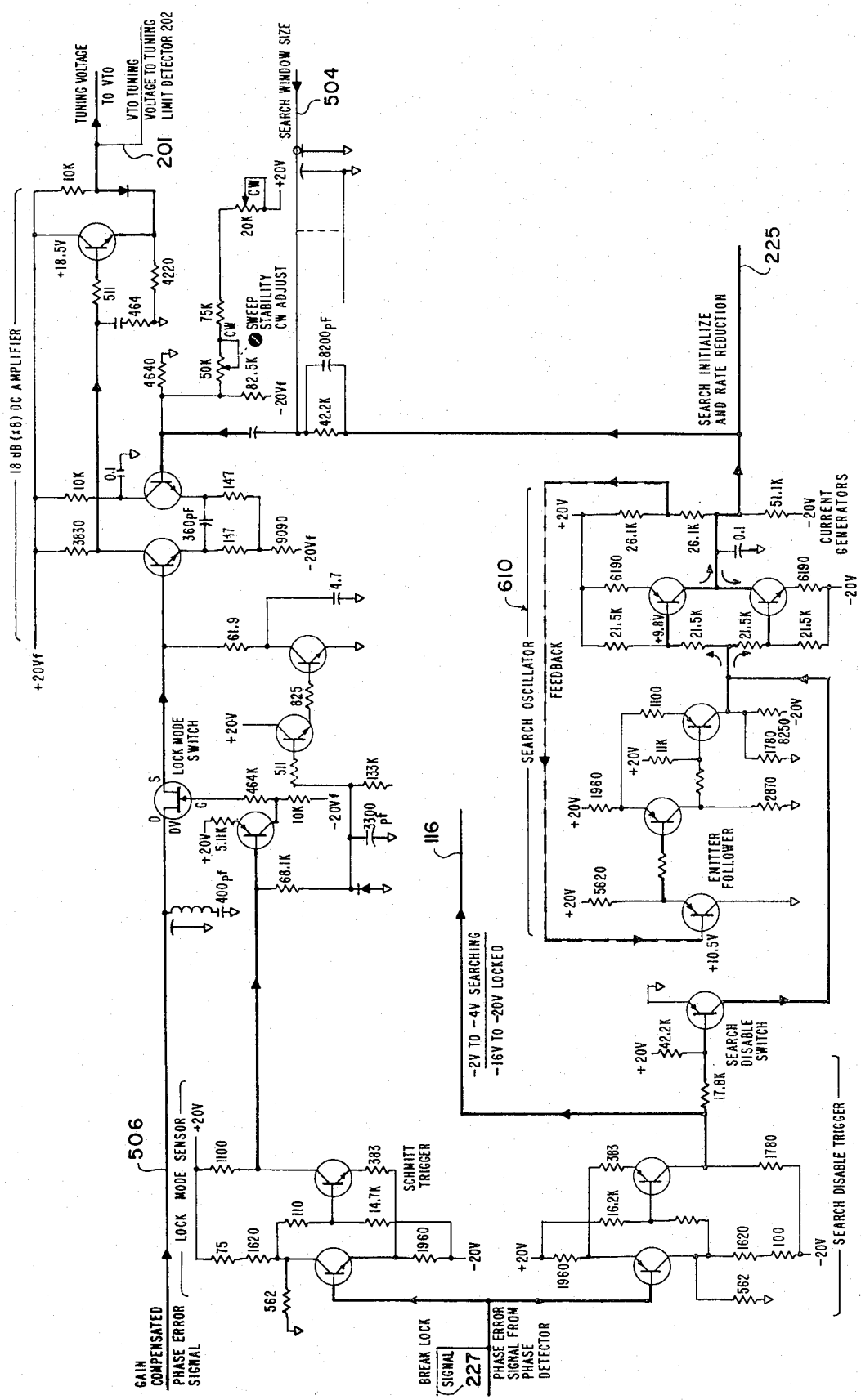
FIG. 6 shows the search oscillator and VTO DC amplifier of the network analyzer used in the preferred embodiment.

One-shot circuit 214 controls the initialization of the network analyzer phase-lock loop through circuits 224 and 226. Circuit 226 immediately breaks the phase-lock loop in response to a signal on line 215, while circuit 224 sends the voltage-tuned oscillator to a starting frequency. One-shot 214 provides the signal on line 215 for 1.5 milliseconds, which allows sufficient time for the network analyzer to settle to a repeatable starting point for relock. After 1.5 milliseconds have elapsed, search initialize circuit 224 releases the network analyzer's search oscillator, thus allowing the network analyzer to search for a lock point. Lock will occur when the network analyzer has found an appropriate harmonic number and is locked on the proper sideband. The search oscillator, 610, shown in FIG. 6, is disabled when lock is achieved.

Figure 3:
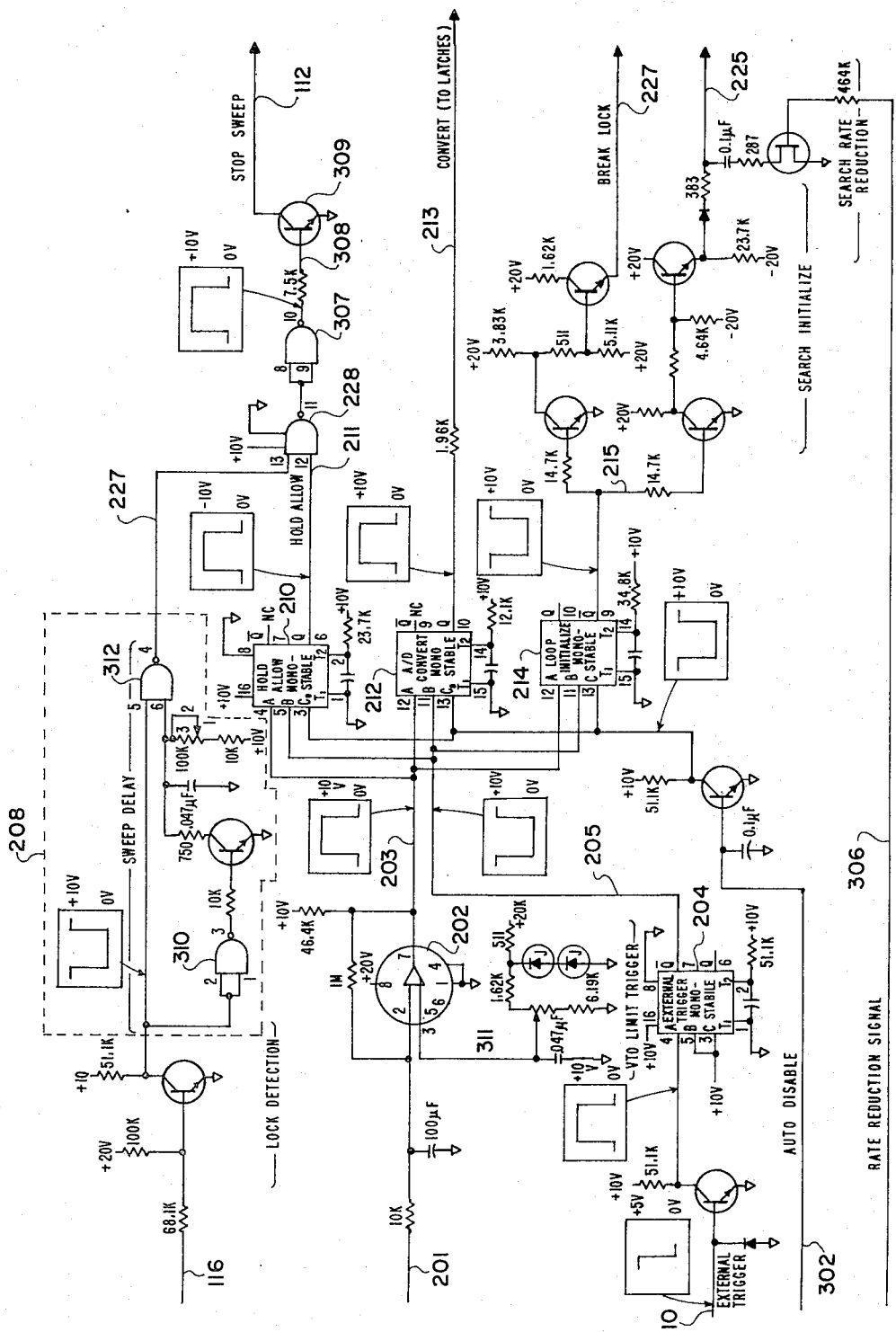
FIG. 3 is a schematic diagram of the timing and logic circuitry which controls the automatic re-locking cycle in the network anlayzer in the preferred embodiment.
Figure 8:
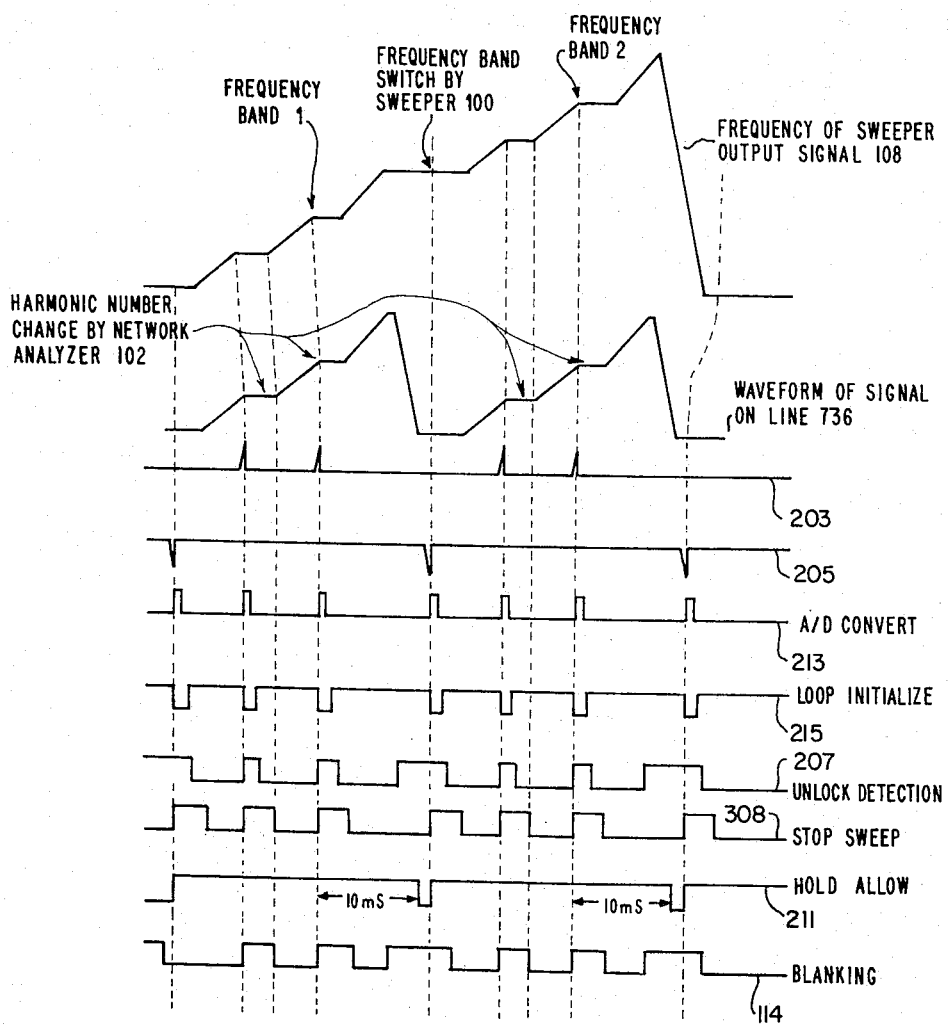
FIG. 8 is a timing diagram of the relationship of some major signals used in the preferred embodiment.
Figure 9:
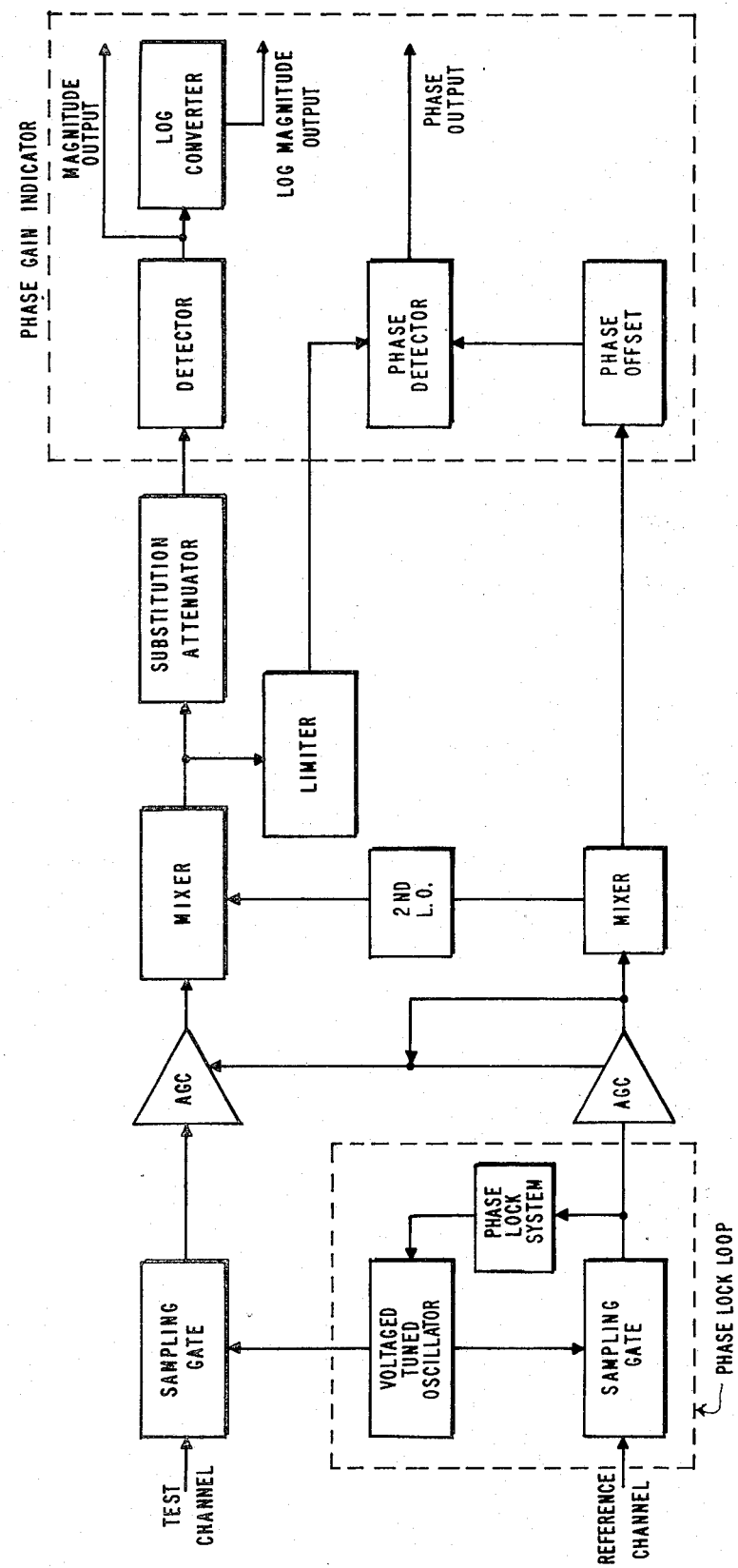
FIG. 9 is a block diagram of the network analyzer having an input phase-lock loop circuit.

The timing and logic circuitry of FIG. 3 is enabled by a signal on a line 302 which is provided by encoding and multiplexing circuit 218. The function of the other input and output signals shown in FIG. 3 is as described above. The waveforms and voltage levels used in the preferred embodiment are indicated in the boxes positioned near the appropriate lines. Timing relationships of some major control signals are shown in FIG. 8. A negative 4-volt signal on line 116 indicates that the network analyzer is not phase-locked on the sweeper output signal on line 108. This causes gate 312 to provide an output signal on a line 227. If one-shot 210 has been enabled by the signal on line 201 through comparator 202 or by the signal on line 110 through one-shot 204, one-shot 210 will produce a high logic level on a line 211. The output of gate 228 connected to one-shot 210 will then go to a low logic level and, through a gate 307, cause transistor 309 to pull line 112 to ground, thereby stopping sweeper 100. The action of the signal on line 112 on the sweeper circuitry is more fully discussed below. When the network analyzer regains phase-lock, the signal on line 112 will remain at ground level for a time determined by sweep delay circuit 208. This delay ensures that the network analyzer circuitry has settled before the sweeper starts again.

The signal on line 201 is the tuning voltage of the VTO in the network analyzer phase-lock loop circuitry. Comparator 202 is triggered when this tuning voltage nears its upper limit. The exact trigger point is determined by the setting of a variable resistor 311. When comparator 202 is triggered, its output signal triggers one-shot 210. A second trigger condition for one-shot 210 occurs when the sweeper begins sweeping after a retrace or after the sweeper completes a frequency band switch. After a retrace operation or a frequency band switch by sweeper 100, the signal on line 110 drops to 0 volts and triggers one-shot 204. The output pulse of one-shot 204 immediately triggers one-shot 210. One-shot 204 and comparator 202 also trigger one-shots 212 and 214. One-shot 214 produces the signal on line 215 which in turn produces the signals on lines 225 and 227. The signal on line 227 causes a break-lock condition to occur in the network analyzer. This signal has the same effect as a very large phase error in the phase-lock loop in the network analyzer. The signal on line 225 sends the voltage-tuned oscillator in the network analyzer phase-lock loop to a starting frequency to begin the search for a new harmonic number. One-shot 212 provides the signal on line 213, which controls the analog to digital conversion of the frequency information on line 106.

Figure 4:
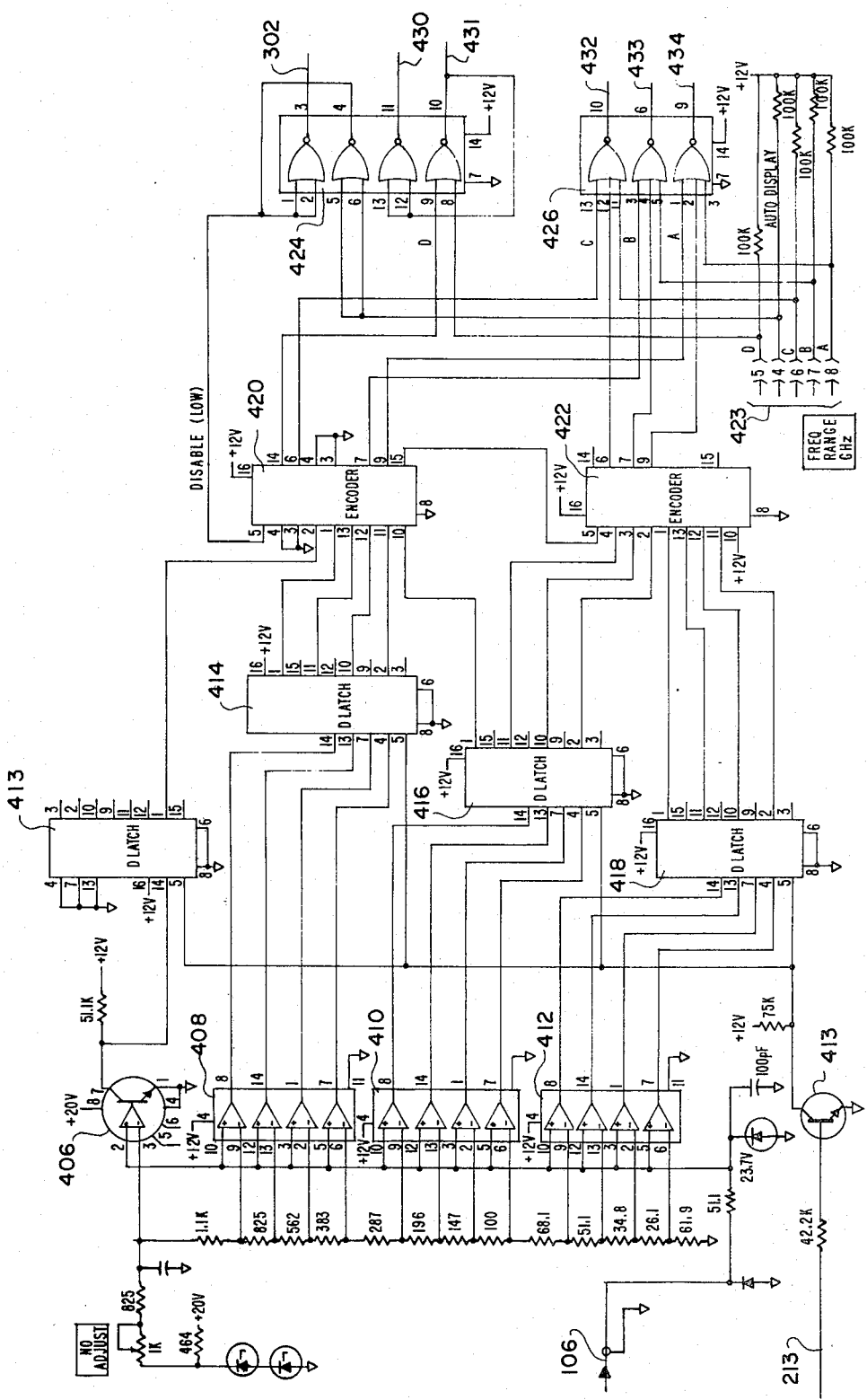
FIG. 4 is a schematic diagram of the circuitry which decodes the frequency information signal from the sweeper.

When enabled by the signal on line 213, the circuits shown in FIG. 4 convert the signal on line 106 to a binary word. This binary word represents the frequency of the sweeper output signal on line 108. Comparators 406, 408, 410 and 412 comprise a logarithmic A/D converter whose outputs go high (+12 volts) in succession as the signal on line 106 increases in magnitude. For example, with a 2.5 volt signal on line 106, the outputs of comparators 410 and 412 are high and the outputs of comparators 406 and 408 are low (0 volt). A high signal on line 213 turns on transistor 413, which opens latches 413, 414, 416 and 418. When the latches are open, their output signals correspond to their input signals. When the signal on line 213 goes low, the latches are closed and any further change on their inputs has no effect on the state of their outputs. Encoders 420 and 422 convert the logical information from the latches to a binary word indicating the frequency range to be selected. This binary word is inverted by gates 424 and 426 and coupled to the programmable resistor circuitry shown in FIG. 5. When operating in the manual mode, the frequency range is selected by signals on lines 423 from front panel controls.

Figure 5:
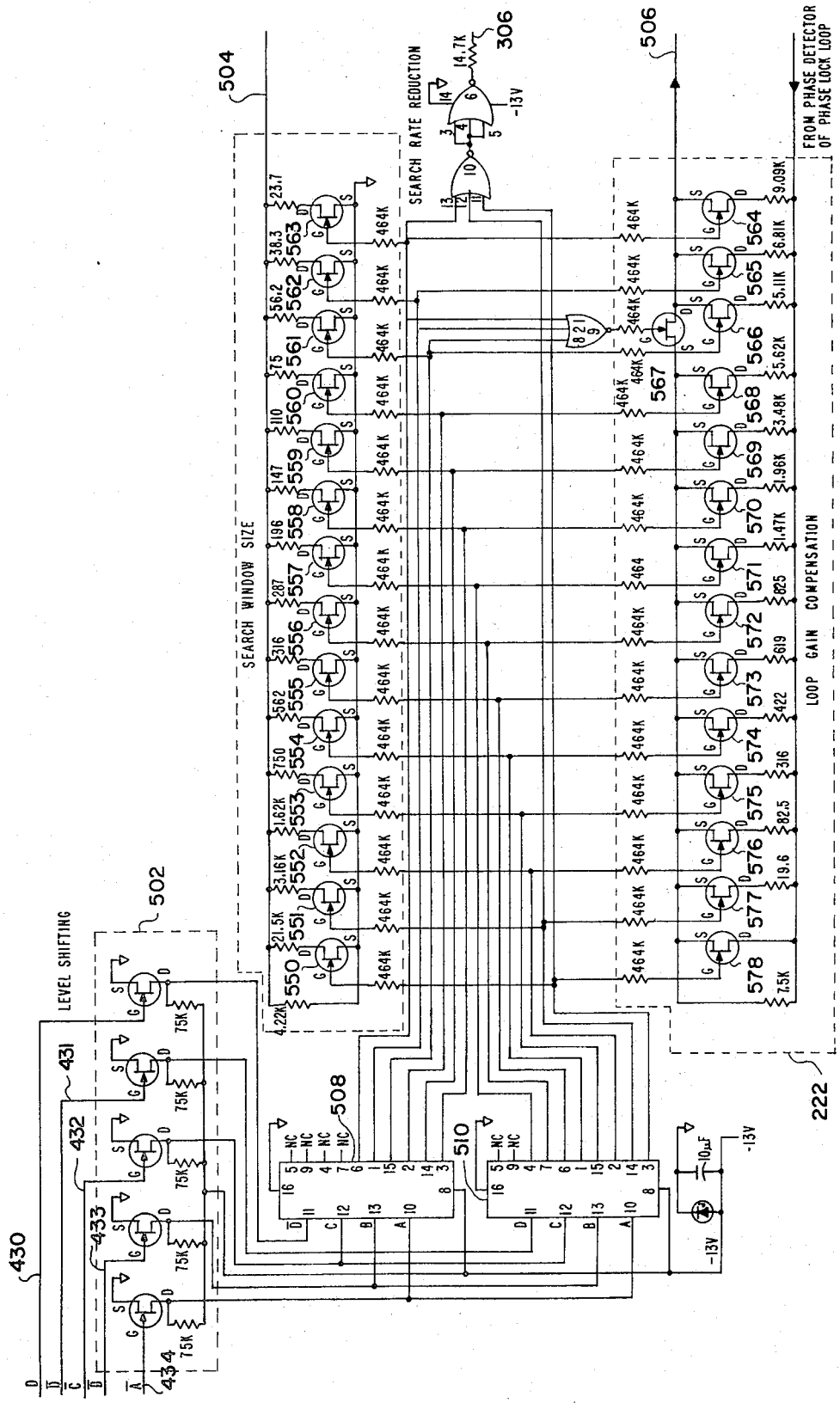
FIG. 5 shows the programmable resistors which determine the loop gain compensation and the search window range of the network analyzer phase-lock loop.

In FIG. 5, there are shown the programmable resistance circuits 220 and 222. Frequency range signals on lines 430, 431, 432, 433 and 434 are received by a level shifter 502, and coupled to decoders 508 and 510. These signals are used to vary the search oscillator signal amplitude and the phase-lock loop gain. For the two lowest and the highest octave bands, a search rate reduction signal is generated on a line 306. Decoder 508 is disabled by the signal on line 430 for the first eight octave bands. Similarly, decoder 510 is disabled by a signal on line 431 for the next six octave bands. The outputs of these decoders control transistors 550 through 578. A signal on line 504 is reduced by switching progressively smaller resistors in parallel to ground as the frequency indicated by decoders 508 and 510 increases in magnitude. At the same time the loop gain is decreased by switching progressively larger resistors in series with a phase-lock loop error signal on a line 506. Signals on lines 504 and 506 are coupled to the search oscillator and the VTO amplifier in the network analyzer. Although such circuits are well known, they are shown in FIG. 6 to aid in a complete understanding of the operation of the preferred embodiment. Note that the search oscillator is disabled by the signal on line 116 when lock is achieved.

Figure 7:
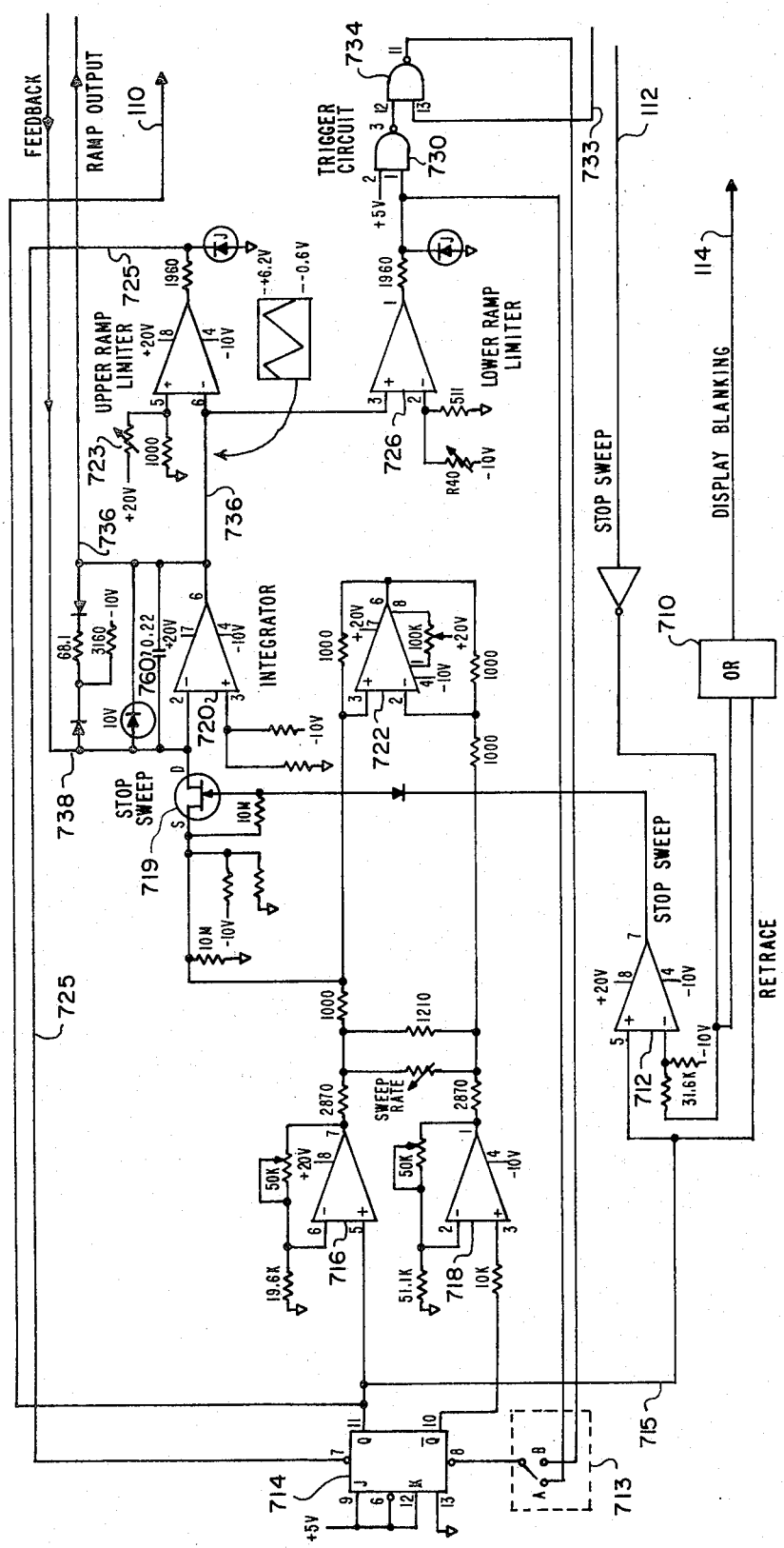
FIG. 7 shows circuitry of the sweeper used in the preferred embodiment.

Referring to FIG. 7, there is shown a schematic diagram of the stop sweep circuitry. Sweeper 100 suspends sweeper operation and generates the signal on line 114 by an OR circuit 710 in response to the signal on line 112. The ramp signal on line 736 controls the frequency of the sweeper output. The frequency of the sweeper output signal on line 108 (FIG. 1) increases as the ramp signal increases in magnitude. Therefore, suspending the generation of the ramp voltage on line 736 causes the sweep signal on line 108 to stop changing in value until the signal on line 112 is removed and the generation of the ramp signal on line 736 is resumed. This suspension of the ramp signal generation is produced by the signal on line 112 causing an amplifier 712 to turn off a transistor 719, thereby stopping an amplifier 720 from charging a capacitor 760. A signal on line 715 deactivates the stop sweep circuit during retrace by providing a signal to amplifier 712, and at the same time blanks the display by sending a signal to gate 710.

The retrace operation starts when a signal on line 725 is generated in response to the detection of an upper limit of the ramp signal on line 736. When this point is reached, the ramp signal on line 736 is returned to its starting value. The sweeper will then repeat the previous sweep sequence. An amplifier 724 detects the reaching of the upper limit by comparing the ramp signal on line 736 to a reference voltage determined by the setting of a variable resistor 723. Amplifier 724 produces a zero logic level signal on line 725 when the ramp output reaches the predetermined upper limit of its range. The signal on line 725 sets a flip-flop 714 which generates the signal on line 110. The setting of flip-flop 714 causes the start of retrace. The ramp signal on line 736 is brought back to its starting value by discharging capacitor 760. When the ramp signal reaches its starting voltage, an amplifier 726 ends the retrace operation by clearing flip-flop 714. A switch 713 controls the start of the next sweep cycle. Flip-flop 714 is cleared by the output of amplifier 726 (position A) or through gate 734 (position B). When switch 713 is in position B, the clearing of flip-flop 714 is also conditioned on the presence of a signal on line 733 which may be generated by a front panel switch or by a signal from another circuit. Note that the clearing of flip-flop 714 automatically starts the generation of the ramp signal on line 736.

FIG. 8 is a timing diagram showing the signal relationships during a typical network analysis. The sweeper output signal on line 108 is composed of two frequency bands. Resynchronization of the system during a frequency band switch by sweeper 100 is controlled by signal 205. Signals 205 and 203 are shown as narrow pulses since they actually last only a few microseconds in duration while the other signals in FIG. 8 are measured in milliseconds. The vertical scale represents increasing frequency for the line representing the frequency of the signal on line 108. For the other signals shown, the vertical scale indicates the signal amplitude.

I claim:

1. A system comprising:
   a sweep oscillator for providing a first electrical signal progressing from a first frequency to a second frequency, for providing a second electrical signal which is related to the frequency of the first signal, and for receiving a third electrical signal and holding the first electrical signal at its present frequency in response thereto; and
   a network analyzer having a phase-lock loop circuit coupled to the sweep oscillator for receiving the first and second electrical signals and for phase-locking on the first electrical signal in response to the second electrical signal, and having an interface circuit for providing the third electrical signal when the phase-lock loop circuit is not locked on the first electrical signal.

2. The system as in claim 1, further comprising:
   a display device coupled to the network analyzer to receive data therefrom; and
   means coupled to the interface circuit and the display device for providing a fourth electrical signal in response to the third electrical signal, the display device suspending operation in response to the fourth electrical signal.

3. The system as in claim 2, wherein the sweep oscillator has a first and second frequency range between the first and second frequencies and provides a fifth electrical signal when the first electrical signal passes from the first frequency range to the second frequency range.

4. The system as in claim 3, wherein the sweep oscillator also provides the fifth electrical signal in response to the finish of a retrace operation.

5. The system as in claim 3, wherein the phase-lock loop circuit comprises a voltage-tuned oscillator and the interface circuit comprises:
   means for responding to an unlocked state in said phase-lock loop circuit and for providing a control signal in response thereto;
   means for detecting when an upper limit is reached by the voltage-tuned oscillator in said phase-lock loop and providing a sixth electrical signal when the upper limit is reached;
   a first one-shot circuit coupled to the means for detecting for providing a first enable signal in response to the fifth electrical signal and to the sixth electrical signal; and
   gating means coupled to the first one-shot and the means for responding for producing the third electrical signal in response to the simultaneous presence of the enable signal and the control signal.

6. The system as in claim 5, wherein the interface circuit further comprises:
   a second one-shot circuit coupled to the means for detecting for providing a second enable signal in response to the fifth and sixth electrical signals; and
   a programmable circuit for providing signals representing a loop gain compensation value and a frequency range for said phase-lock loop circuit in response to the second electrical signal and the second enable signal.

7. The system as in claim 6, wherein the interface circuit further includes a third one-shot circuit coupled to the means for responding for providing a third enable signal in response to the fifth and sixth electrical signals, a break lock circuit for causing said phase-lock loop circuit to lose phase-lock in response to the third enable signal, and a search initialize circuit for causing the voltage-tuned oscillator in said phase-lock loop circuit to be tuned to a starting frequency in response to the third enable signal.

8. A network analyzer comprising:
   first input means for receiving a first electrical signal progressing from a first frequency to a second frequency;
   second input means for receiving a second electrical signal which is related to the frequency of the first signal;
   a phase-lock loop circuit having a voltage-tuned oscillator and coupled to the first and second input means to receive the first and second electrical signals and for phase-locking on the first electrical signal in response to the second electrical signal; and
   an interface circuit coupled to the phase-lock loop circuit for providing a third electrical signal when the phase-lock loop circuit is not locked on the first electrical signal.

9. The network analyzer as in claim 8, wherein the network analyzer further comprises an interface circuit comprising:
   means coupled to the phase-lock loop circuit for responding to an unlocked state in said phase-lock loop circuit and for providing a control signal in response thereto;
   means coupled to the phase-lock loop circuit for detecting when an upper limit is reached by the voltage-tuned oscillator in said phase-lock loop circuit and for providing a sixth electrical signal when the upper limit is reached;
   a first one-shot circuit coupled to the means for detecting for providing a first enable signal in response to the fifth electrical signal; and
   gating means coupled to the first one-shot and to the means for responding for producing the third electrical signal is response to the simultaneous presence of the enable signal and the control signal.

10. The network analyzer as in claim 9, wherein the phase-lock loop includes a circuit for providing loop gain compensation in response to a signal representing a loop gain compensation value, and a search oscillator for tuning said voltage-tuned oscillator in response to a signal representing a frequency range; and
    wherein the interface circuit further comprises a second one-shot circuit coupled to the means for detecting for providing a second enable signal in response to the fifth and sixth electrical signals, a programmable circuit coupled to the phase-lock loop for providing the signal representing a loop gain compensation value and the signal representing a frequency range for said search oscillator in response to the second electrical signal and the second enable signal.

11. The network analyzer as in claim 10, wherein the interface circuit further comprises:
    a third one-shot circuit coupled to the means for responding for providing a third enable signal in response to the fifth and sixth electrical signals;
    a break lock circuit coupled to the phase-lock loop circuit for causing said phase-lock loop circuit to lose phase-lock in response to the third enable signal; and
    a search initialize circuit coupled to the phase-lock loop circuit for causing the voltage-tuned oscillator in said phase-lock loop circuit to be tuned to a starting frequency in response to the third enable signal.

* * * * *